(12) United States Patent
Ishizeki et al.

(10) Patent No.: US 7,915,731 B2
(45) Date of Patent: Mar. 29, 2011

(54) SEMICONDUCTOR DEVICE AND MANUFACTURING METHOD THEREOF

(75) Inventors: Hiroshi Ishizeki, Gunma (JP); Masafumi Uehara, Gunma (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 206 days.

(21) Appl. No.: 12/389,857

(22) Filed: Feb. 20, 2009

(65) Prior Publication Data

US 2009/0212426 A1 Aug. 27, 2009

(30) Foreign Application Priority Data

Feb. 22, 2008 (JP) ................................. 2008-041006

(51) Int. Cl.
H01L 23/48 (2006.01)
(52) U.S. Cl. .................. 257/737; 257/E23.069
(58) Field of Classification Search .................. 257/737, 257/E23.069
See application file for complete search history.

(56) References Cited

U.S. PATENT DOCUMENTS

2009/0212426 A1* 8/2009 Ishizeki et al. ................ 257/737

FOREIGN PATENT DOCUMENTS

JP 7-161722 6/1995
JP 2003-17521 1/2003

* cited by examiner

*Primary Examiner* — Mark Prenty
(74) *Attorney, Agent, or Firm* — Morrison & Foerster LLP

(57) ABSTRACT

In a semiconductor device, a region under a pad electrode with a bump can be utilized efficiently and a large amount of force is prevented from applying locally to a semiconductor substrate under the bump when the semiconductor device is mounted. A first layer metal wiring is formed on the semiconductor substrate. A pad electrode is formed on the first layer metal wiring through an interlayer insulation film. The pad electrode is connected with the first layer metal wiring through a via hole that is formed in the interlayer insulation film. A protection film is formed on the pad electrode. The protection film has an opening to expose the pad electrode and an island-shaped protection film formed in the opening. An Au bump connected with the pad electrode through the opening in the protection film is formed on the pad electrode. The via hole is formed under the island-shaped protection film, and incompletely filled with a portion of the pad electrode.

9 Claims, 10 Drawing Sheets

SEMICONDUCTOR DEVICE AND MANUFACTURING METHOD THEREOF

CROSS-REFERENCE OF THE INVENTION

This application claims priority from Japanese Patent Application No. 2008-041006, the content of which is incorporated herein by reference in its entirety.

BACKGROUND OF THE INVENTION

1. Field of the Invention

This invention relates to a semiconductor device having a protruding electrode that is disposed on a pad electrode and its manufacturing method.

2. Description of the Related Art

In a conventional semiconductor device for surface mounting, a bump is formed on a pad electrode. FIG. 10 is a plan view showing a pad portion of the semiconductor device. FIG. 11 is a cross-sectional view of a section B-B shown in FIG. 10. In the conventional pad portion, it is avoided to place an incompletely filled via hole 55 under an exposed portion 56a of the pad electrode 56, which is exposed in an opening 57a in a protection film 57, as shown in the figures.

The reason to avoid it is that placing the incompletely filled via hole 55 under the exposed portion 56a of the pad electrode 56 causes problems that an inside of the incompletely filled via hole 55 is corroded by chemicals used in etching a protection film 57 for passivation and left in a vacancy that is caused in the via hole 55 as will be described later, or plating solution used in forming the Au bump 59 by a plating method and left in the vacancy, and that cracks are caused in an interlayer insulation film 54 that surrounds the via hole 55 depending on an amount of a pressure imposed on the semiconductor device in a COG (Chip On Glass) mounting, if the incompletely filled via hole 55 is placed under the exposed portion 56a of the pad electrode 56.

Therefore, placing the incompletely filled via hole 55 under the exposed portion 56a of the pad electrode 56 is avoided and the incompletely filled via hole 55 is formed in the interlayer insulation film 54 on a first layer metal wiring 53 in a region adjacent the exposed portion 56a of the pad electrode 56.

When an Au bump 59 is formed, a peripheral portion 59a of the Au bump 59 is jutted out by an amount corresponding to a height of a step 58 of the protection film 57 at a periphery of the exposed portion 56a of the pad electrode 56, as shown in FIG. 11.

This kind of semiconductor device is disclosed in Japanese Patent Application Publication Nos. H07-161722 and 2003-017521, for example.

Since placing the incompletely filled via hole 55 under the exposed portion 56a of the pad electrode 56 is avoided because of the reasons described above, there is a problem that a region under the pad electrode 56 is not utilized efficiently.

Also, there is a problem that a large amount of force is applied locally to a semiconductor substrate 51 under the Au bump 59 when the semiconductor device is mounted, since the peripheral portion 59a of the Au bump 59 is jutted out in the conventional semiconductor device. Particularly when a semiconductor element 52 is formed in the semiconductor substrate 51 under the Au bump 59, there is a problem that the large amount of force is applied to the semiconductor element 52.

SUMMARY OF THE INVENTION

The invention provides a semiconductor device including a semiconductor substrate, a lower layer wiring placed on the semiconductor substrate, an interlayer insulation film having a via hole and placed on the lower layer wiring, a pad electrode placed on the interlayer insulation film so as to occupy part of the via hole and to be connected to the lower layer wiring, a protection film placed on the pad electrode so as to occupy part of the via hole and including an island portion and a peripheral portion that are separated from each other so as to have an opening between the island portion and the peripheral portion, and a protruding electrode placed on the protection film and connected to the pad electrode through the opening in the protection film. In plan view of the semiconductor device, the island portion overlaps with the via hole.

The invention also provides a method of manufacturing a semiconductor device. The method includes providing a semiconductor substrate, forming a lower layer wiring on the semiconductor substrate, forming an interlayer insulation film so as to cover the lower layer wiring, forming a via hole in the interlayer insulation film to expose part of the lower layer wiring, forming a pad electrode on the interlayer insulation film so as to occupy part of the via hole and to be connected to the lower layer wiring through the via hole, forming a protection film on the pad electrode so as to have an opening to expose part of the pad electrode and have an island portion in the opening that is separated from the rest of the protection film, and forming a protruding electrode on the protection film so as to be connected to the pad electrode through the opening in the protection film. The island portion of the protection film occupies part of the via hole and overlaps with the via hole in plan view of the semiconductor device.

DETAILED DESCRIPTION OF THE INVENTION

Figure 1:
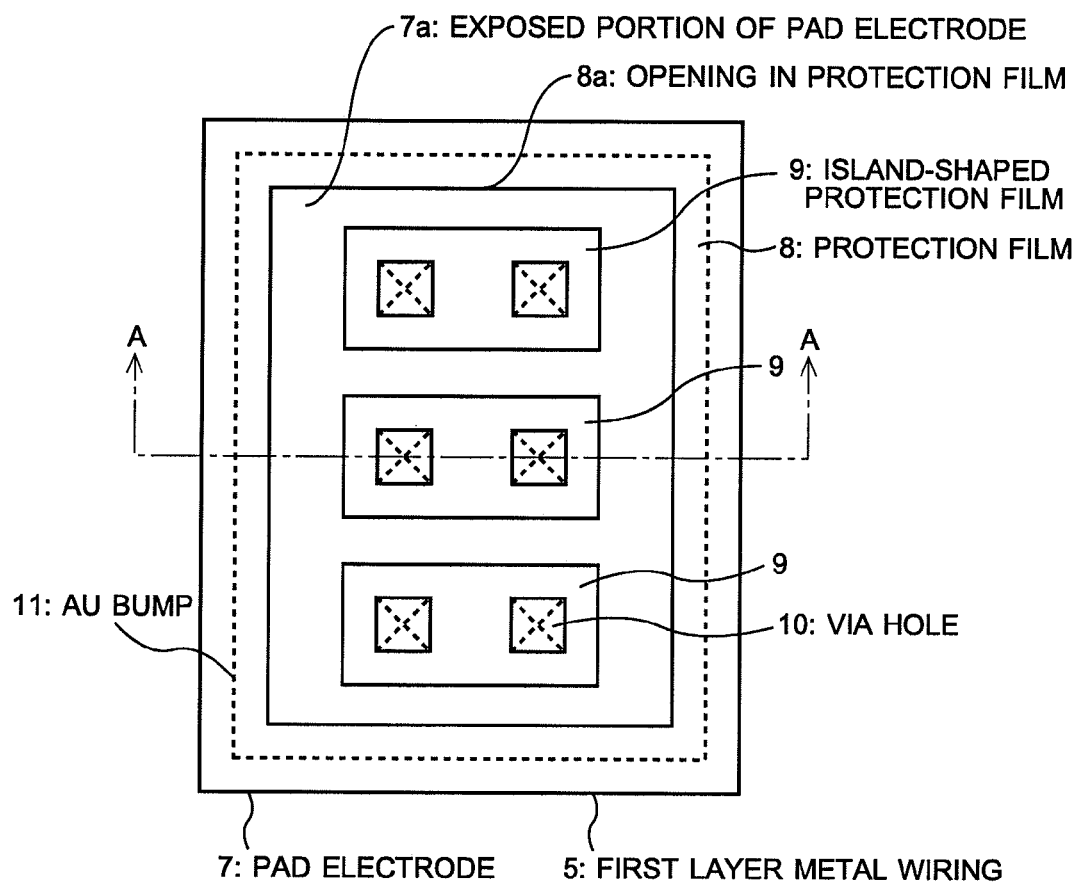
FIG. 1 is a plan view showing a semiconductor device according to an embodiment of this invention.
Figure 2:
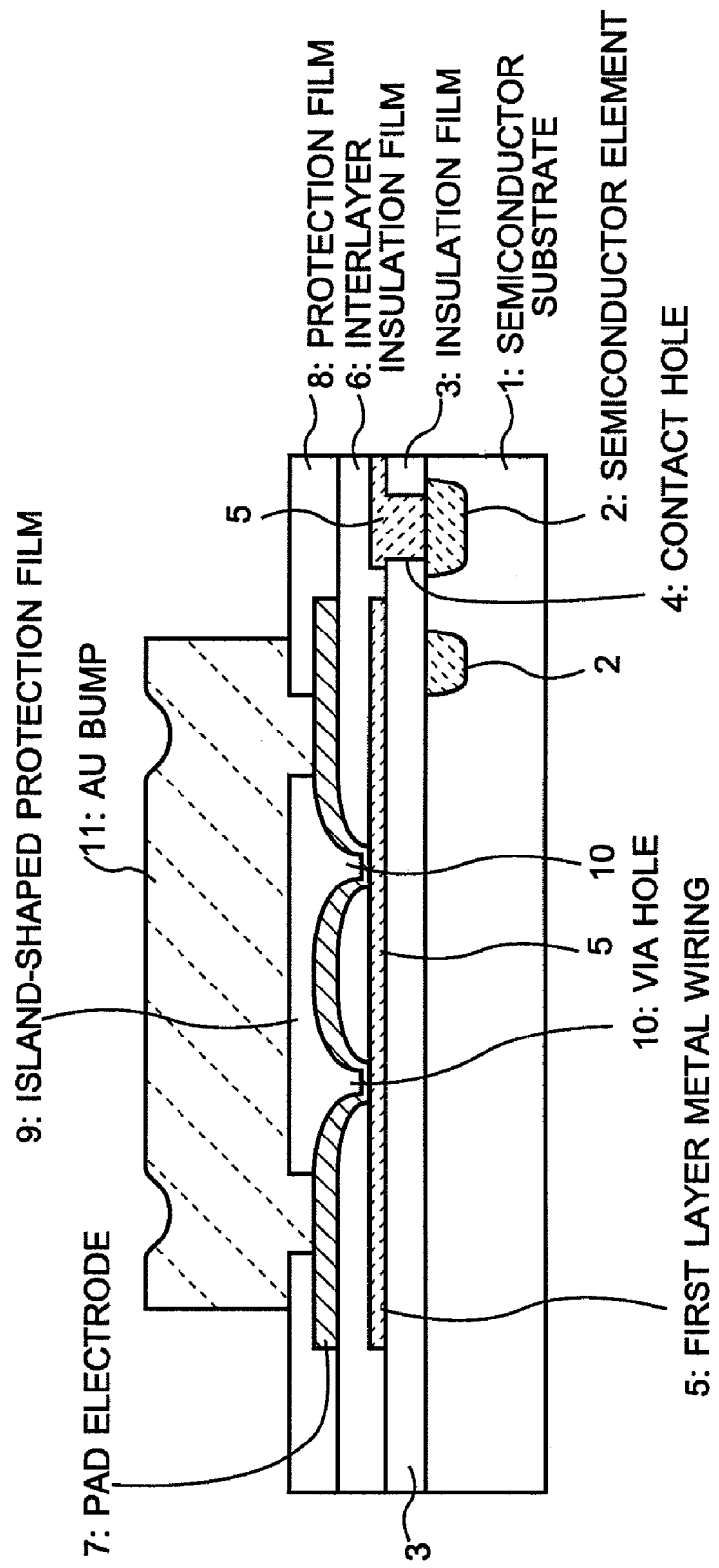
FIG. 2 is a cross-sectional view showing a section A-A in FIG. 1.

A semiconductor device according to an embodiment of this invention will be described taking an LCD (Liquid Crystal Display) driver IC that drives an LCD device as an example. FIG. 1 is a plan view showing a structure of a pad portion of the LCD driver IC. FIG. 2 is a cross-sectional view of a section A-A shown in FIG. 1 and a related portion.

According to the embodiment of this invention, it is made possible to reduce a pattern size of the pad portion and utilize a semiconductor substrate 1 more efficiently, since via holes 10 are formed under a pad electrode 7. Although the LCD driver IC varies by product type, reduction in the pattern size of the pad portion has a significant effect, since the LCD driver IC has approximately 200 to 700 pad electrodes 7.

Figure 3:
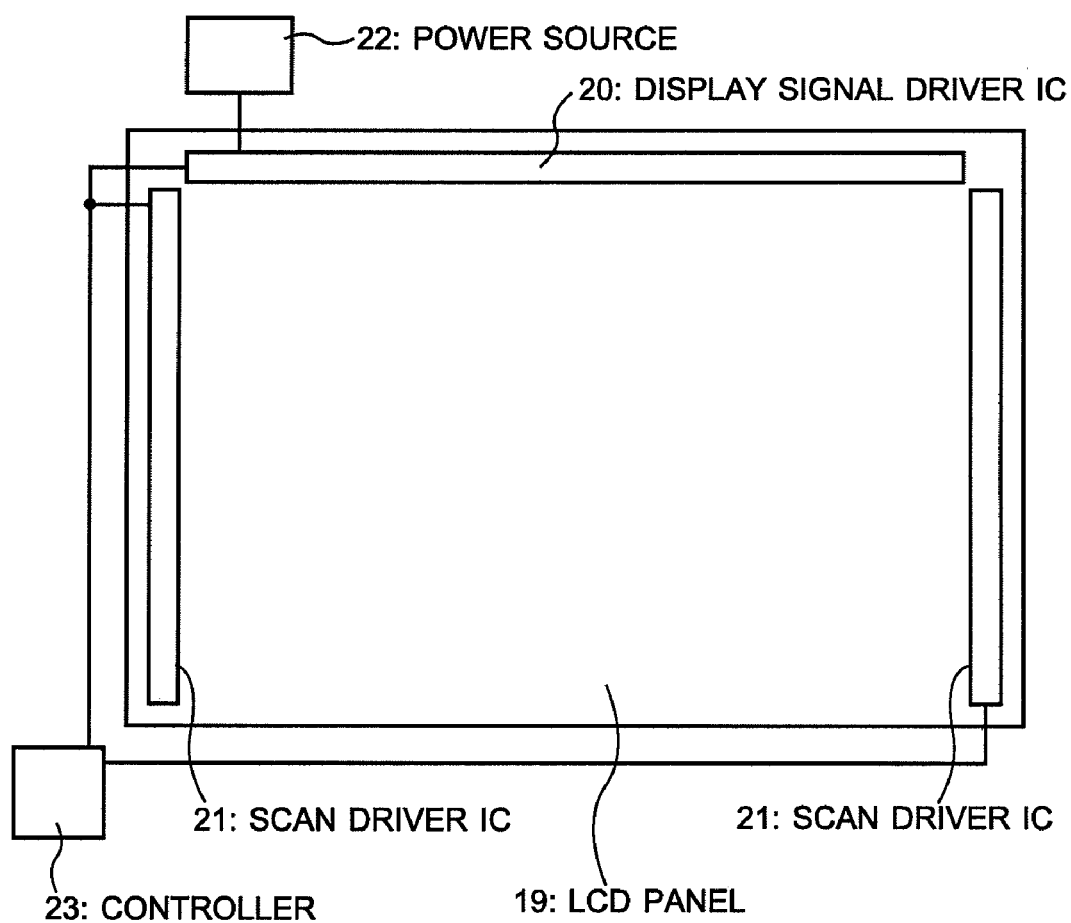
FIG. 3 is a block diagram of an LCD panel.

FIG. 3 is a block diagram of the LCD device. A display signal driver IC 20 is a kind of LCD driver IC and a scan driver IC 21 is another kind of LCD driver IC. The display signal driver IC 20 and the scan driver ICs 21 provide pixels arrayed in a matrix form on an LCD panel 19 with display signals and scan signals, respectively. A power source 22 provides the display signal driver IC 20 and the scan driver ICs 21 with a power supply. The display signal driver IC 20 and the scan driver ICs 21 drive the pixels required by an instruction of a controller 23. Au bumps 11 (an example of a protruding electrode) of the display signal driver IC 20 and the scan driver ICs 21 are directly compression-bonded to panel electrodes (not shown) on a glass substrate on which the LCD panel 19 is formed, making a so-called COG (Chip On Glass) structure.

Detailed structure of the pad portion and its manufacturing method will be described hereafter, referring to FIGS. 1 and 2. A semiconductor element 2 is formed in the semiconductor substrate 1 through conventional IC manufacturing process steps such as oxidation, photolithography, etching, ion implantation and thermal treatment. The semiconductor element 2 includes a transistor, a resistor or the like, for example. After that, a contact hole 4 to connect the semiconductor element 2 with a first layer metal wiring 5 (an example of a lower layer wiring) formed on an insulation film 3 is formed in the insulation film 3 that is formed on the semiconductor element 2. Next, aluminum or the like is deposited as a first layer metal by sputtering or the like, and the first layer metal wiring 5 is formed by photolithography or the like.

After that, an interlayer insulation film 6 is formed over the entire surface of the semiconductor substrate 1 by LPCVD (Low Pressure Chemical Vapor Deposition) or the like. In this case, it is preferable that the interlayer insulation film 6 takes a multi-layer structure with the uppermost layer being made of BPSG (Boro-Phospho Silicate Glass) or the like which is reflowable and has a high etch rate in order that an upper side surface of a so-called via hole 10, that is an opening to connect the first layer metal wiring 5 with a second layer metal wiring including the pad electrode 7, is formed in a smooth shape.

The interlayer insulation film 6 has a thickness of approximately 1 μm. The via holes 10 are formed in it through photolithography or the like. The via hole 10 is approximately 1 μm in diameter on its upper surface. It is preferably formed by wet and dry etching so that its upper side surface is not angulated. By doing so, it is made possible that the via hole 10 is sufficiently covered with the second layer metal that is to be deposited later by sputtering of the like, and that the first layer metal wiring 5 makes a good contact with the pad electrode 7 and the like that are made of the second layer metal.

Figure 4:
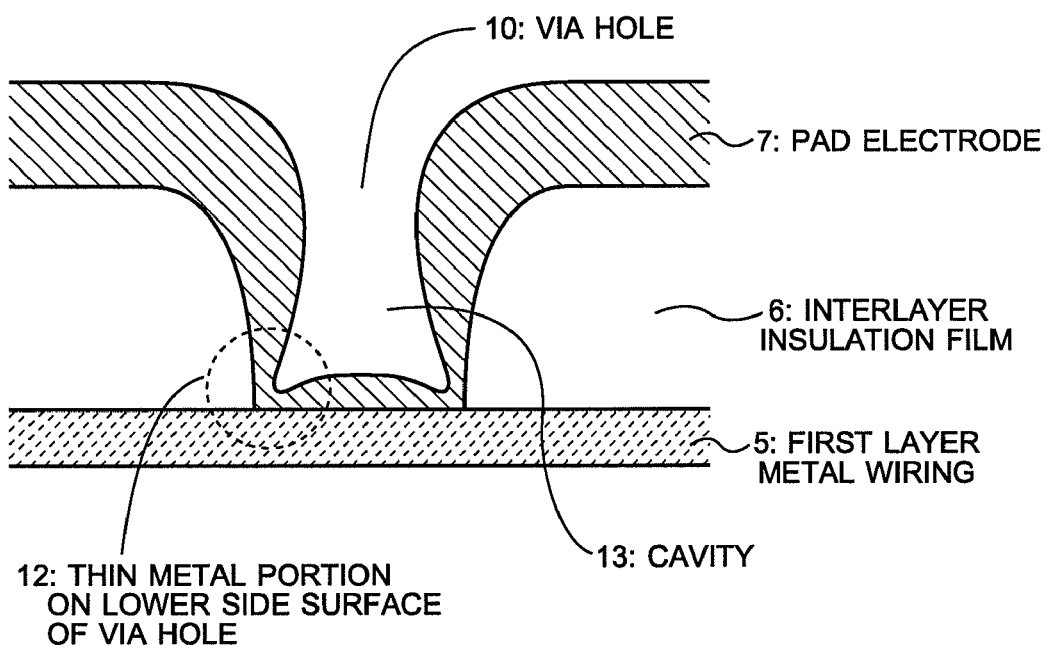
FIG. 4 is a cross-sectional view showing a via hole after a pad electrode is formed.

Even when careful process steps as described above are taken, however, it is not possible to fill the via hole 10 completely with the second layer metal that forms the pad electrode 7, and a cavity 13 is formed in the via hole 10 while a thin metal portion 12 is formed on a lower side surface of the via hole 10, as shown in FIG. 4.

Then, after depositing a protection film 8 made of a silicon oxide film and a silicon nitride film all over the semiconductor substrate 1 by plasma CVD or the like, an opening 8a in the protection film 8 and an exposed portion 7a of the pad electrode 7 that makes a contact surface with the Au bump 11, that is the protruding electrode, are formed by photolithography or the like. In this case, the via hole 10 is covered with an island-shaped protection film 9 that is formed over the via hole 10 in a shape of an island. On the other hand, in the case where the via hole 10 is not covered with the island-shaped protection film 9 and left exposed, there may be caused a problem that chemicals used in etching the protection film 8 are left in the cavity 13 in the via hole 10.

Figure 5:
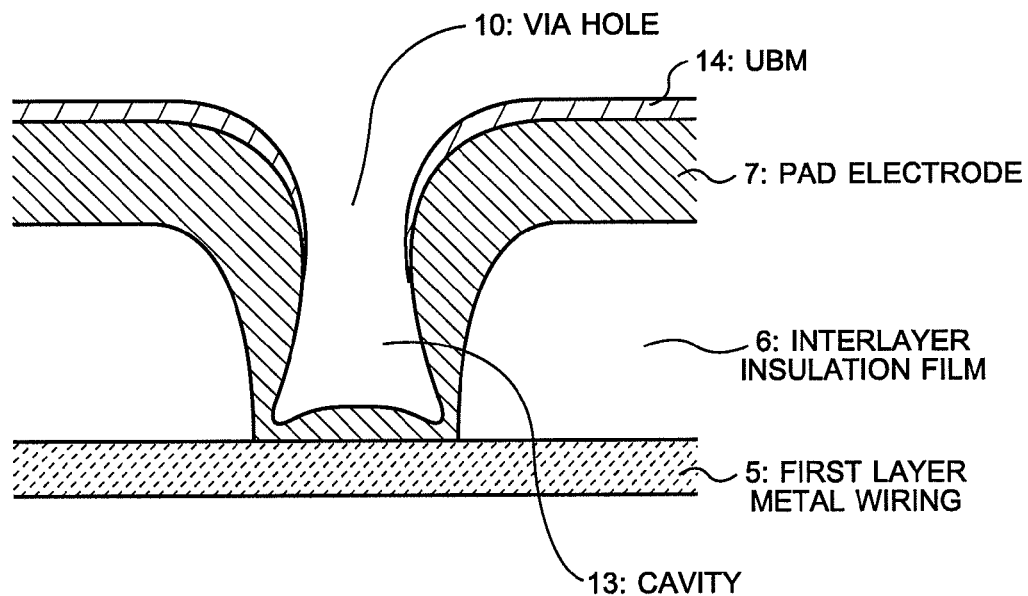
FIG. 5 is a cross-sectional view showing the via hole according to a reference example.
Figure 6:
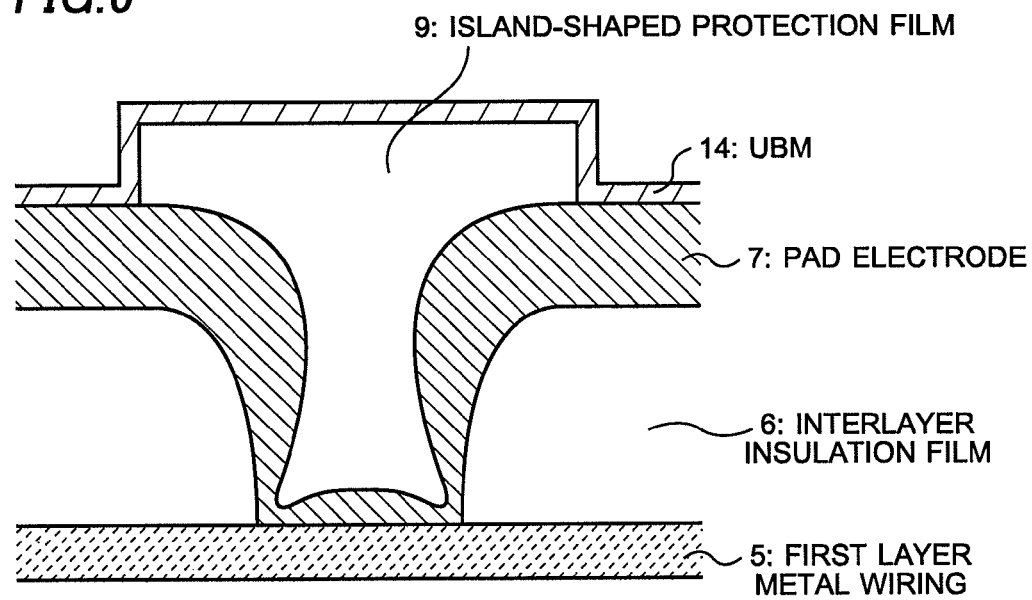
FIG. 6 is a cross-sectional view showing the via hole according to the embodiment of this invention.

After that, as pre-processing for Au plating, UBM (Under Bump Metal) 14, which is made of multi-layers of metal such as Cr, Ni and Au, and serves as a seed layer or the like, is deposited by sputtering on the island-shaped protection film 9 and the pad electrode 7, as shown in FIG. 6. In this case also, if the via hole 10 is not covered with the island-shaped protection film 9, the UBM 14 is not sufficiently formed on the pad electrode 7 in the cavity 13 in the via hole 10 as shown in FIG. 5 because of poor step coverage of the UBM 14 that is formed by the sputtering.

Figure 7:
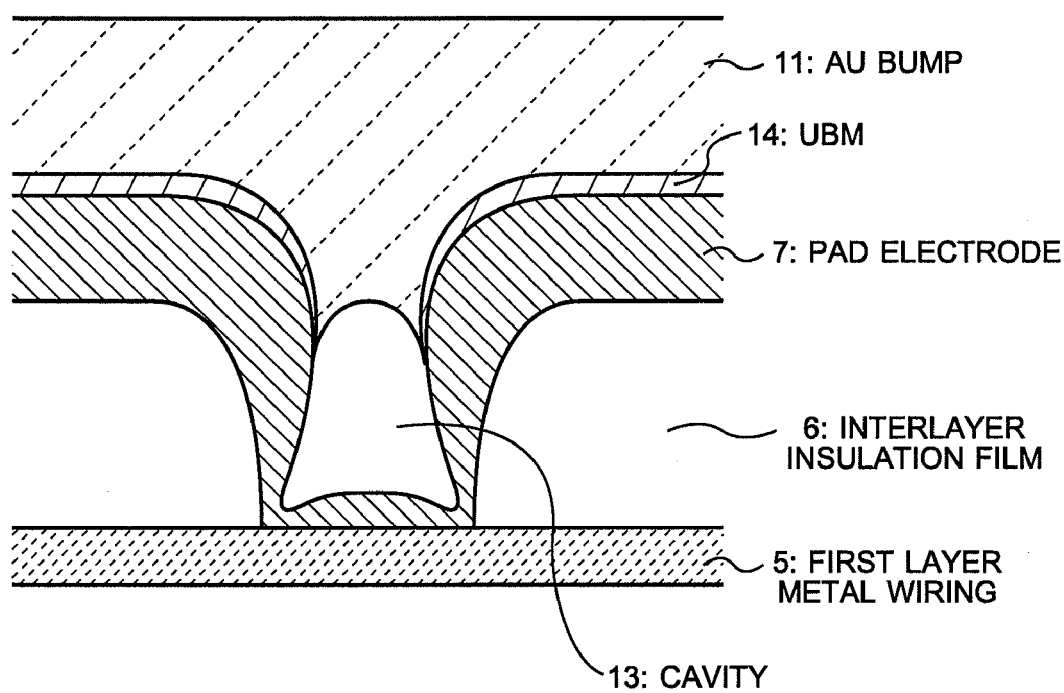
FIG. 7 is a cross-sectional view showing the via hole according to the reference example.

Next, the UBM 14 is formed into a pattern for the plating by photolithography or the like. After a mask for the Au plating is formed, the Au bump 11 is formed by electrolytic plating. In this case, if the via hole 10 is not covered with the island-shaped protection film 9, the Au plating is not formed over the pad electrode 7 in the cavity 13 of the via hole 10 shown in FIG. 5, on which the UBM 14 is not deposited, and a portion of the cavity 13 is left filled with plating solution and sealed with the Au plating layer, as shown in FIG. 7.

Finally, removing the mask for the Au plating completes the semiconductor device having the incompletely filled via hole 10 under the pad electrode 7 according to the embodiment. If the via hole 10 is not covered with the island-shaped protection film 9, there is caused a serious reliability problem that the residual chemicals for the etching of the protection film or the plating solution left in the vacancy 13 reacts with the pad electrode 7 and corrodes the portion of the pad electrode material over time.

Since the via hole 10 according to the embodiment of this invention is covered with the island-shaped protection film 9, the cavity 13 is neither exposed to the chemicals for the etching of the protection film nor soaked in the plating solution. Therefore, the reliability problem due to the corrosion of the pad electrode material as described above can be solved.

In addition, when the via hole 10 is covered with the island-shaped protection film 9 as shown in FIGS. 2 and 6, the cavity 13 in the via hole 10 is filled with the island-shaped protection film 9 formed by plasma CVD that gives better step coverage than sputtering. Therefore, distorted stress caused by the force in the COG mounting when the cavity 13 remains in the via hole 10 is eliminated to reduce the risk that cracks are caused in the interlayer insulation film 6 around the via hole 10.

Therefore, by adopting the new pad structure shown in FIGS. 1 and 2, the area occupied by the pad portion can be reduced while the harmful effects that would be caused when the unfilled via hole 10 is formed under the exposed portion 7a of the pad electrode 7 is precluded.

Figure 8:
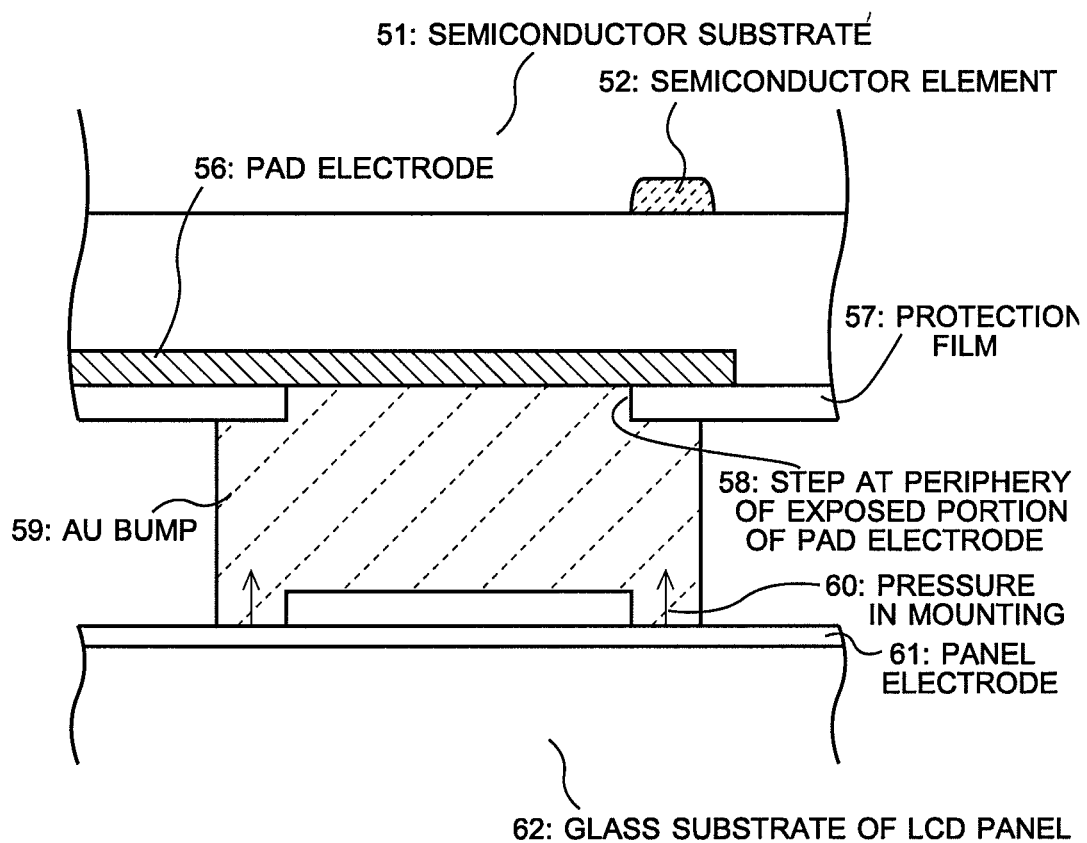
FIG. 8 is a cross-sectional view showing how pressure is applied in mounting the semiconductor device according to the reference example.
Figure 9:
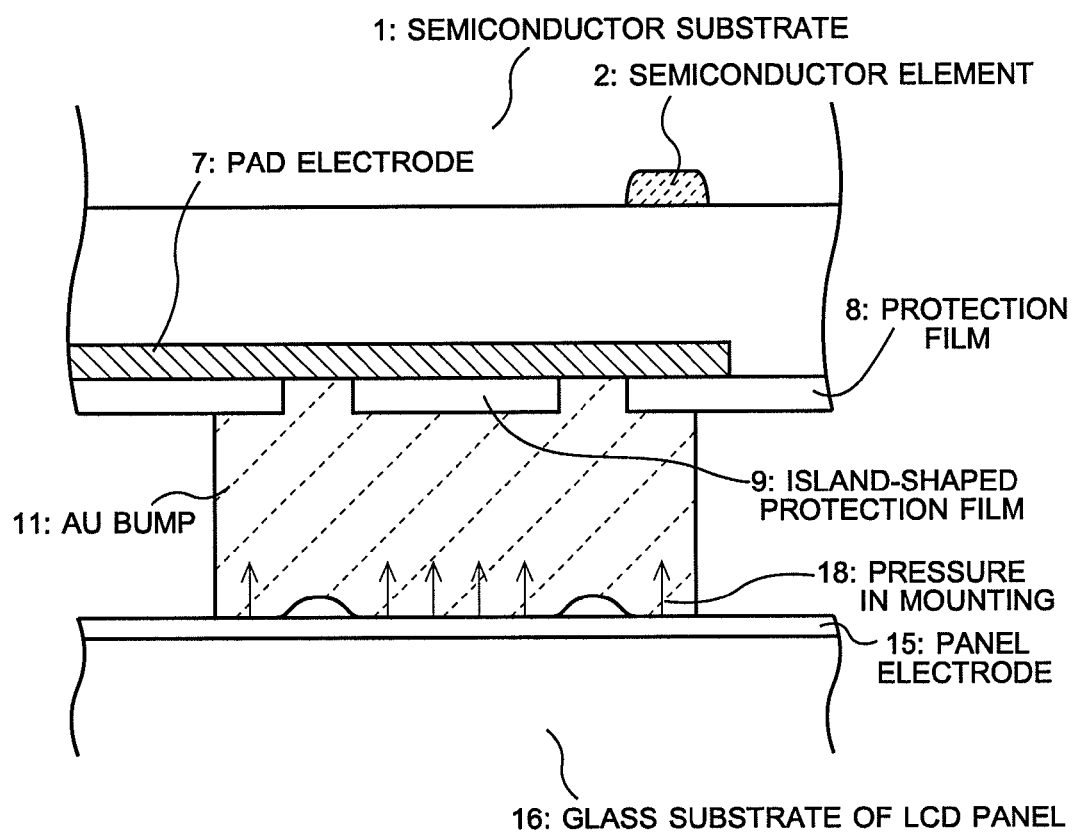
FIG. 9 is a cross-sectional view showing how pressure is applied in mounting the semiconductor device according the embodiment of this invention.
Figure 10:
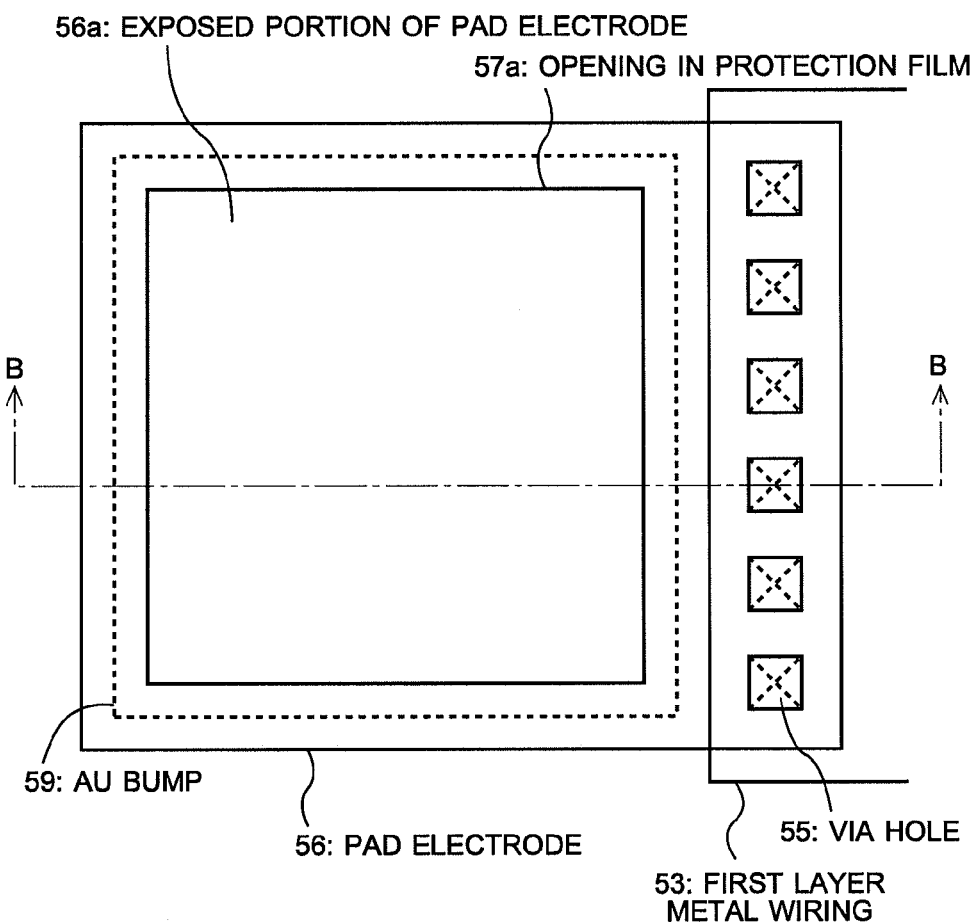
FIG. 10 is a plan view showing a semiconductor device according to a conventional art.
Figure 11:
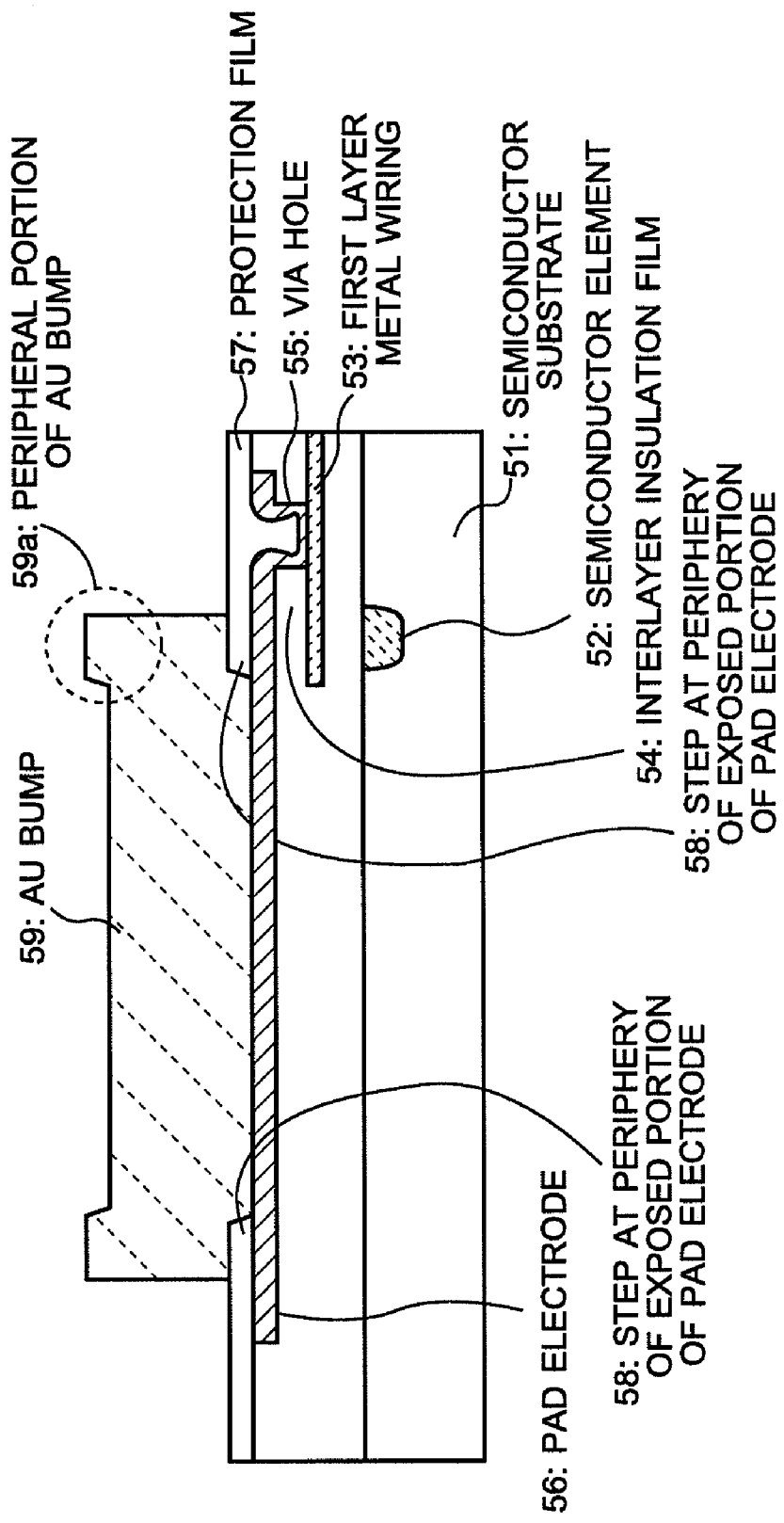
FIG. 11 is a cross-sectional view showing the semiconductor device according to the conventional art.

Next, another merit materialized by the embodiment of this invention is explained hereafter. The driver IC having the pad structure shown in FIG. 2 is held so that the Au bump 11 faces downward and mechanically compression-bonded to the underlying panel electrode 15 on the glass substrate 16 of the LCD panel using a COG mounting apparatus, as shown in FIG. 9. In this case, if the pad electrode 56 in the opening 57a in the protection film 57 is not covered with the island-shaped protection film 9 as in the prior art shown in FIGS. 10 and 11, only peripheral portion 59a of the Au bump 59 above the step 58 of the protection film 57 at the periphery of the exposed portion 56a of the pad electrode 56 makes contact with the panel electrode 61 on the glass substrate 62 of the LCD panel as shown in FIG. 8, since the peripheral portion 59a of the Au bump 59 is higher than inner portion by a thickness of the protection film 57 of about 1 μm that is a height of the step 58 at the periphery of the exposed portion 56a of the pad electrode 56, as shown in FIG. 11.

In that case, a larger-than-usual pressure 60 in mounting is applied to the semiconductor element 52 or the like under the peripheral portion 59a of the Au bump 59 to cause the deterioration in the device characteristics. The smaller a ratio of the peripheral area to the total pad area is, the greater the pressure 60 is. Although the pressure 60 is not born long time only by the periphery of the exposed portion 56a of the pad electrode 56 because the protruding electrode is the relatively soft Au bump 59, influence of the pressure 60 on the semiconductor element 52 of advanced miniaturization is not small even it lasts only a short period of time.

In the semiconductor device according to the embodiment of this invention, on the other hand, because the island-shaped protection film 9 is formed on the exposed portions 7a of the pad electrode 7, flatness of the surface of the Au bump 11 as a whole is improved, and it is made possible to disperse the pressure 18 in mounting and to minimize its influence on the semiconductor element 2.

A purpose to form the island-shaped protection film 9 in the form of an island left in the exposed portion 7a of the pad electrode 7 is to prevent a crack from extending to the whole protection film 8 when the crack is caused in the island. This effect is enhanced by composing the island-shaped protection film 9 of a plurality of islands, as shown in FIG. 1. Even when the crack is caused in one of the plurality of islands, the Au bump 11 can be sustained by the other islands and the reliability of the semiconductor device is improved.

According to the embodiment of this invention, the region under the pad electrode can be utilized efficiently by disposing the via hole under the pad electrode. The problems related to the via hole have been solved by forming the via hole under the island-shaped protection film so that the inside of the incompletely filled via hole is not exposed to the chemicals for etching the protection film and that the direct contact between the protruding electrode and the pad electrode in the via hole is eliminated.

Also, according to the embodiment of this invention, since the island-shaped protection film is formed in the opening in the protection film, the flatness of the surface of the protruding electrode can be improved so that the large amount of force in mounting the semiconductor device is prevented from applying locally to the semiconductor substrate.

What is claimed is:

1. A semiconductor device comprising:
   a semiconductor substrate;
   a lower layer wiring disposed on the semiconductor substrate;
   an interlayer insulation film having a via hole and disposed on the lower layer wiring;
   a pad electrode disposed on the interlayer insulation film so as to occupy part of the via hole and to be connected to the lower layer wiring;
   a protection film disposed on the pad electrode so as to occupy part of the via hole and comprising an island portion and a peripheral portion that are separated from each other so as to have an opening between the island portion and the peripheral portion; and
   a protruding electrode disposed on the protection film and connected to the pad electrode through the opening in the protection film,
   wherein in plan view of the semiconductor device the island portion overlaps with the via hole.

2. The semiconductor device of claim 1, further comprising another island portion of the protection film that is separated from the island portion and the peripheral portion of the protection film.

3. The semiconductor device of claim 1, further comprising another via hole in the interlayer insulation film for connection between the lower layer wiring and the pad electrode that overlaps with the island portion in plan view of the semiconductor device.

4. The semiconductor device of claim 2, further comprising another via hole in the interlayer insulation film for connection between the lower layer wiring and the pad electrode that overlaps with the island portion in plan view of the semiconductor device.

5. The semiconductor device of claim 1, further comprising a semiconductor element formed in the semiconductor substrate so as to overlap with the protruding electrode in plan view of the semiconductor device.

6. The semiconductor device of claim 2, further comprising a semiconductor element formed in the semiconductor substrate so as to overlap with the protruding electrode in plan view of the semiconductor device.

7. The semiconductor device of claim 3, further comprising a semiconductor element formed in the semiconductor substrate so as to overlap with the protruding electrode in plan view of the semiconductor device.

8. The semiconductor device of claim 4, further comprising a semiconductor element formed in the semiconductor substrate so as to overlap with the protruding electrode in plan view of the semiconductor device.

9. The semiconductor device of claim 1, wherein the protection film comprises a silicon oxide film and a silicon nitride film.

* * * * *